(12) United States Patent
Toyama et al.

(10) Patent No.: US 6,603,219 B2
(45) Date of Patent: Aug. 5, 2003

(54) SEMICONDUCTOR INTEGRATED CIRCUIT

(75) Inventors: Masaomi Toyama, Osaka (JP); Shiro Dosho, Osaka (JP); Naoshi Yanagisawa, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 117 days.

(21) Appl. No.: 09/801,472

(22) Filed: Mar. 8, 2001

(65) Prior Publication Data

US 2001/0033107 A1 Oct. 25, 2001

(30) Foreign Application Priority Data

Mar. 8, 2000 (JP) .......................... 2000-064220

(51) Int. Cl.[7] ................................. H02J 1/00
(52) U.S. Cl. .......................... 307/38; 438/130
(58) Field of Search .................. 307/38, 43; 438/130

(56) References Cited

U.S. PATENT DOCUMENTS

| 4,380,823 | A | * | 4/1983 | Higashiyama et al. ....... 455/143 |
| 5,147,815 | A | * | 9/1992 | Casto .......................... 257/666 |
| 5,340,767 | A | * | 8/1994 | Flaherty ....................... 438/128 |
| 5,412,333 | A | | 5/1995 | Okunaga |
| 5,467,304 | A | | 11/1995 | Uchida et al. |
| 5,682,105 | A | | 10/1997 | Fujima |
| 5,727,231 | A | * | 3/1998 | Bartley et al. ................. 710/38 |
| 5,751,173 | A | | 5/1998 | McMahon et al. |
| 5,761,145 | A | * | 6/1998 | Zagar et al. ............ 365/189.07 |
| 6,107,874 | A | * | 8/2000 | Ohashi ........................ 327/407 |
| 6,281,745 | B1 | * | 8/2001 | Kim et al. .................... 327/541 |

FOREIGN PATENT DOCUMENTS

| EP | 0 584 739 | 8/1993 |
| JP | 57-192046 | 11/1982 |
| JP | 60-28257 | 2/1985 |
| JP | 63-283150 | 11/1988 |
| JP | 5-62465 | 3/1993 |
| JP | 5-267578 | 10/1993 |
| JP | 8-220191 | 8/1996 |
| JP | 11-17119 | 1/1999 |
| JP | 11-97473 | 4/1999 |

OTHER PUBLICATIONS

European Search Report dated May 21, 2001 for EP 01 10 4590.

* cited by examiner

Primary Examiner—Brian Sircus
Assistant Examiner—Sharon A. Polk
(74) Attorney, Agent, or Firm—RatnerPrestia

(57) ABSTRACT

A semiconductor integrated circuit includes a plurality of units. Each of the units includes a power supply pad, a function circuit, and a power supply control circuit. The plurality of units each have a first state in which the function circuit is in an operating state by the power supply pad being at a prescribed operating potential and a second state in which the function circuit is in a non-operating state by the power supply pad being at a prescribed non-operating potential. The power supply control circuit includes a switching circuit for connecting the power supply pad to the prescribed non-operating potential. The power supply control circuit in each of the plurality of units closes the switching circuit when at least one of the other units is in the first state and opens the switching circuit otherwise.

6 Claims, 10 Drawing Sheets

SEMICONDUCTOR INTEGRATED CIRCUIT

BACKGROUND OF THE INVENTION

1. Field of the Invention

The present invention relates to a semiconductor integrated circuit, and specifically to a semiconductor integrated circuit having a function selecting circuit for selecting a prescribed function circuit by bonding option.

2. Description of the Related Art

A technology referred to as bonding option is known as a method for selecting a desired function circuit among function circuits included in semiconductor integrated circuits. According to this technology, the wiring from lead frames of a semiconductor integrated circuit to power supply pads is changed to select a desired function circuit among a plurality of function circuits having different functions. Using bonding option during the production of semiconductor integrated circuits, a prescribed function circuit can be selected without changing a mask for wiring after impurity diffusion is finished. In this way, semiconductor integrated circuits having different functions can be produced without changing any production integrated circuit can be reduced.

According to general bonding option, one power supply pad connected to a prescribed circuit to be selected and a specific lead frame terminal connected to a prescribed potential outside the chip package are connected to each other by a bonding wire. By thus connecting the power supply pad, the function circuit connected to the power supply pad is made effective. By connecting the power supply pad to a grounded lead frame, the function circuit connected to the power supply pad is made ineffective.

With bonding option, the power supply pad corresponding to the selected function circuit is connected to a bonding wire for supplying power to the selected function circuit, and power supply pads corresponding to unselected function circuits are not connected to any bonding wires. Accordingly, the potential of each of the power supply pads corresponding to the unselected function circuits fluctuates. When this occurs, the unselected function circuits which should not operate may undesirably malfunction. Such a malfunction tends to occur more easily as the integration degree of semiconductor integrated circuits is improved.

Therefore, the power supply pads of unselected function circuits need to be grounded so that the potential of the power supply pads is fixed.

Japanese Patent No. 2054176 discloses a semiconductor integrated circuit in which power supply pads respectively corresponding to function circuits are grounded via resistors. According to the technology disclosed in Japanese Patent No. 2054176, the potential of the power supply pads corresponding to the unselected function circuits is fixed to the ground level and thus does not fluctuate.

The semiconductor integrated circuit described in Japanese Patent No. 2054176, however, has the following drawback. The power supply pads respectively corresponding the function circuits are grounded via resistors, as described above. Accordingly, when a bonding wire is connected to an power supply pad of a selected function circuit so as to fix that power supply pad to an operating potential of the selected function circuit, a shoot-through current flows to ground from the power supply pad via the resistor. When the shoot-through current flows, power consumption of the semiconductor integrated circuit is undesirably raised.

SUMMARY OF THE INVENTION

According to one aspect of the invention, a semiconductor integrated circuit includes a plurality of units. Each of the units includes a power supply pad, a function circuit, and a power supply control circuit. The plurality of units each have a first state in which the function circuit is in an operating state by the power supply pad being at a prescribed operating potential and a second state in which the function circuit is in a non-operating state by the power supply pad being at a prescribed non-operating potential. The power supply control circuit includes a switching circuit for connecting the power supply pad to the prescribed non-operating potential. The power supply control circuit in each of the plurality of units closes the switching circuit when at least one of the other units is in the first state and opens the switching circuit In one embodiment of the invention, the semiconductor integrated circuit further includes a resistor connected to the switching circuit in series.

In one embodiment of the invention, the semiconductor integrated circuit further includes a signal control circuit for selectively outputting an output from one of the function circuits based on potentials of the power supply pads in the plurality of units.

In one embodiment of the invention, the power supply pad in one of the plurality of units is connected to a terminal having the prescribed operating potential via a conductive member.

In one embodiment of the invention, the conductive member is a bonding wire.

In one embodiment of the invention, the terminal includes a plurality of first terminal regions, the power supply pad includes a plurality of second terminal regions, and the conductive member is applied or caused to adhere by pressure to the plurality of first terminal regions and the plurality of second terminal regions.

Thus, the invention described herein makes possible the advantages of providing a semiconductor integrated circuit having a function selecting circuit operable at a high level of reliability while consuming low power.

These and other advantages of the present invention will become apparent to those skilled in the art upon reading and understanding the following detailed description with reference to the accompanying figures.

DESCRIPTION OF THE EMBODIMENTS

Hereinafter, the present invention will be described by way of illustrative examples with reference to the accompanying drawings.

Figure 1:
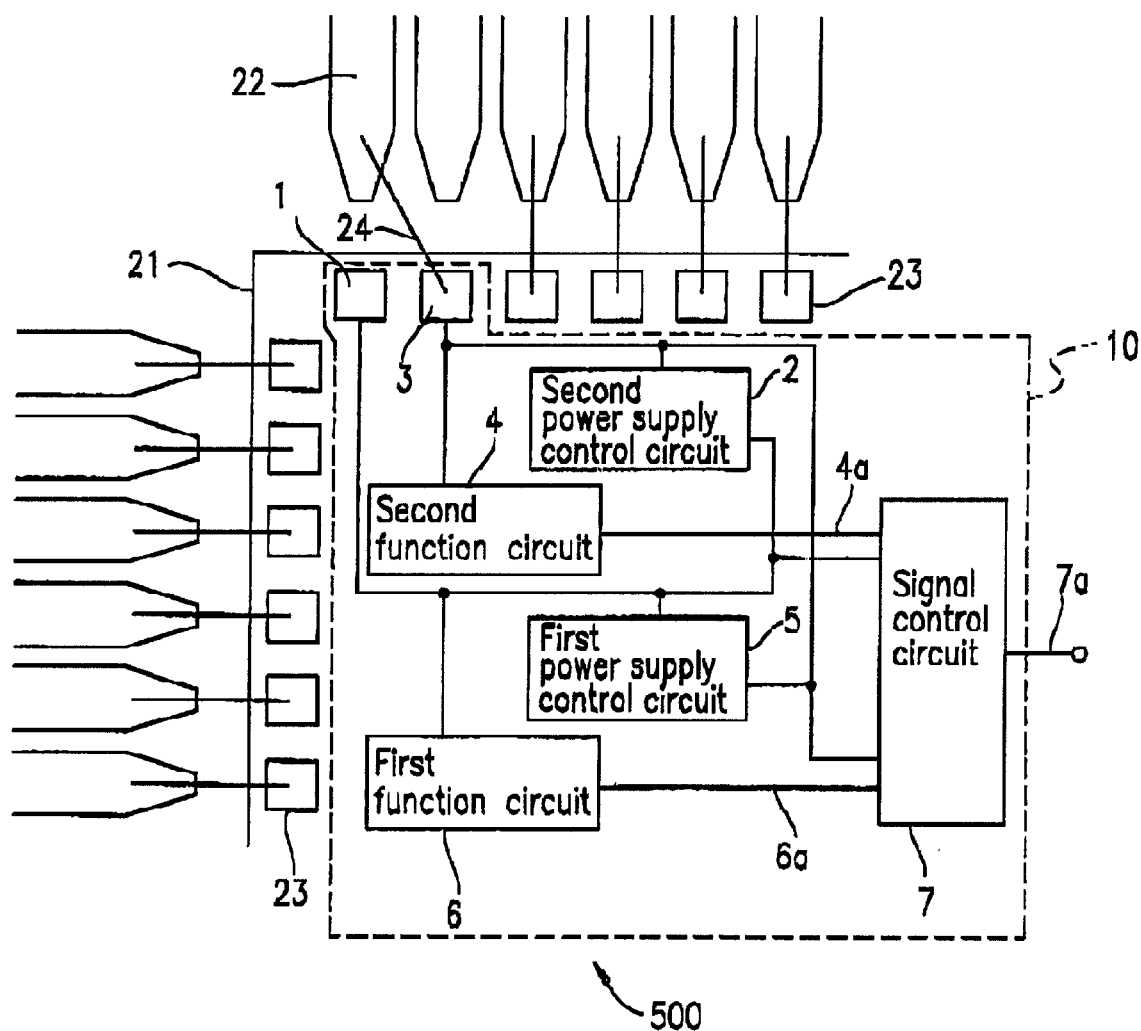
FIG. 1 is a schematic view illustrating a semiconductor integrated circuit 500 according to the present invention.

FIG. 1 shows a semiconductor integrated circuit 500 according to the present invention. As shown in FIG. 1, the semiconductor integrated circuit 500 includes a chip package 21, which includes a function selecting circuit 10. The chip package 21 includes power supply pads 23 aligned along a periphery of the chip package 21. The chip package 21 includes a first power supply pad 1 and a second power supply pad 3 which are included in the function selecting circuit 10.

The function selecting circuit 10 includes a first function circuit 6, a second function circuit 4, a first power supply control circuit 5, a second power supply control circuit 2, and a signal control circuit 7.

The chip package 21 is surrounded by a plurality of lead frame terminals 22.

When a bonding wire 24 is connected to the first power supply pad 1 from one of the lead frame terminals 22 which is connected to a power supply (not shown) or is grounded, the first function circuit 6 included in the function selecting circuit 10 is made effective and thus becomes operable, and the second function circuit 4 also included in the function selecting circuit 10 is made ineffective and thus becomes inoperable. When a bonding wire 24 is connected to the second power supply pad 3, the second function circuit 4 is made effective and becomes operable, and the first function circuit 6 is made ineffective and becomes inoperable. The lead frame terminals 22 have an operating potential of the first function circuit 6 and the second function circuit 4 (prescribed operating potential).

Figure 2:
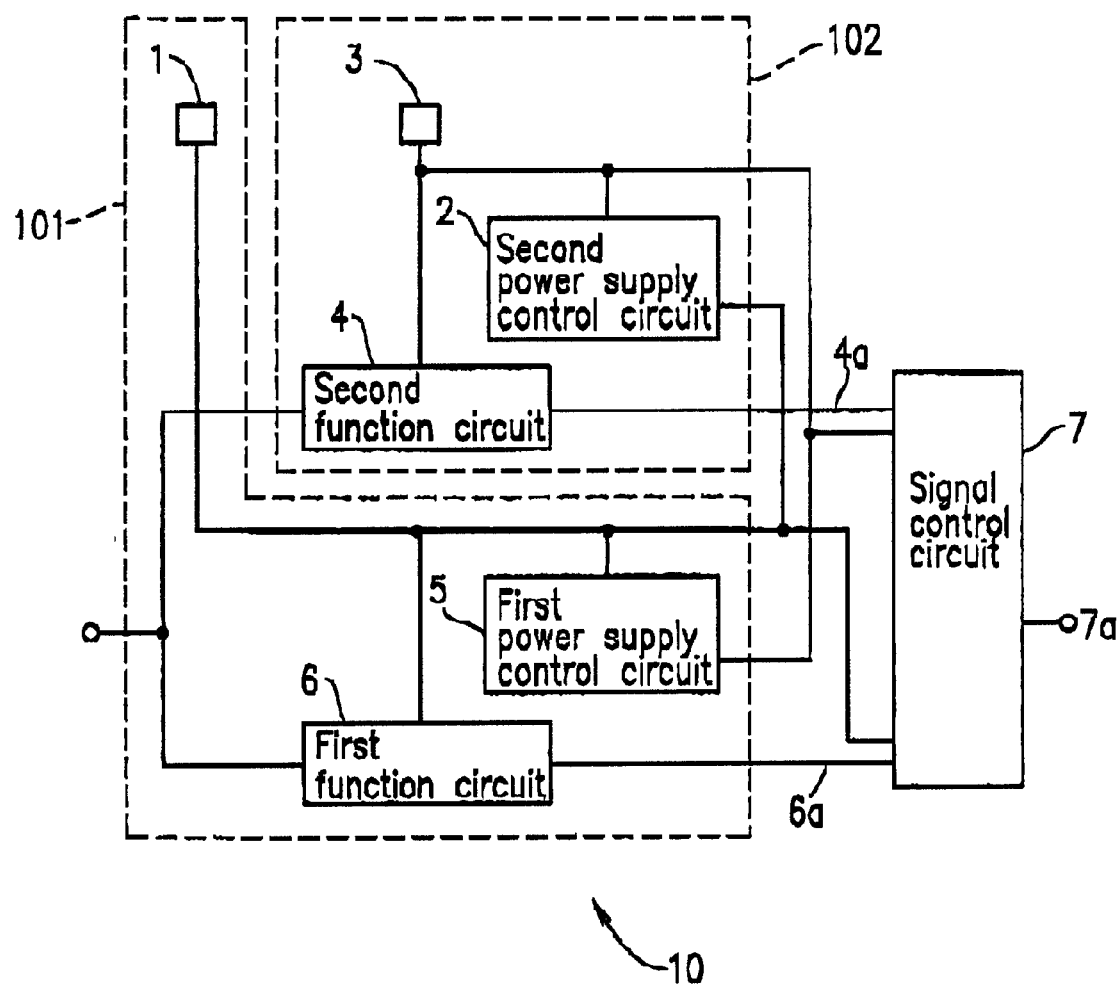
FIG. 2 is a block diagram illustrating a structure of a function selecting circuit 10, included in the semiconductor integrated circuit shown in FIG. 1, as one example of the function selecting circuit according to the present invention.

FIG. 2 shows a structure of the function selecting circuit 10. The function selecting circuit 10 includes a first unit 101, a second unit 102 and a signal control circuit 7.

The first unit 101 includes the first sower supply pad 1, the first function circuit 6, and the first power supply control circuit 5. The second unit 102 includes the second power supply pad 3, the second function circuit 4, and the second power supply control circuit 2.

The first power supply pad 1 is connected to the first function circuit 6 having a specific function and is also connected to the second power supply control circuit 2. The second power supply control circuit 2 controls the potential of the second power supply pad 3. The second power supply pad 3 is connected to the second function circuit 4 having a specific function and is also connected to the first power supply control circuit 5. The first power supply control circuit 5 controls the potential of the first power supply pad 1.

An output 6a of the first function circuit 6 and an output 4a of the second function circuit 4 are supplied to the signal control circuit 7.

When the first function circuit 6 is selected by bonding option, the first power supply pad 1 is fixed to the potential at which the first function circuit 6 is operable. When the first power supply pad 1 is fixed to such a potential, the second power supply control circuit 2 is turned on. When the second power supply control circuit 2 is turned on, the second power supply pad 3 is fixed to the potential at which the second function circuit 4 is inoperable.

When the second function circuit 4 is selected by bonding option, the second power supply pad 3 is fixed to the potential at which the second function circuit 4 is operable. When the second power supply pad 3 is fixed to such a potential, the first power supply control circuit 5 is turned on. When the first power supply control circuit 5 is turned on, the first power supply pad 1 is fixed to the potential at which the first function circuit 6 is inoperable.

The outputs 6a and 4a of the first and second function circuits 6 and 4 are input to the signal control circuit 7 as described above. The signal control circuit 7 selectively outputs either the output 6a or 4a as an output 7a in accordance with the potential of the first power supply pad 1 and the potential of the second power supply pad 3.

Figure 3:
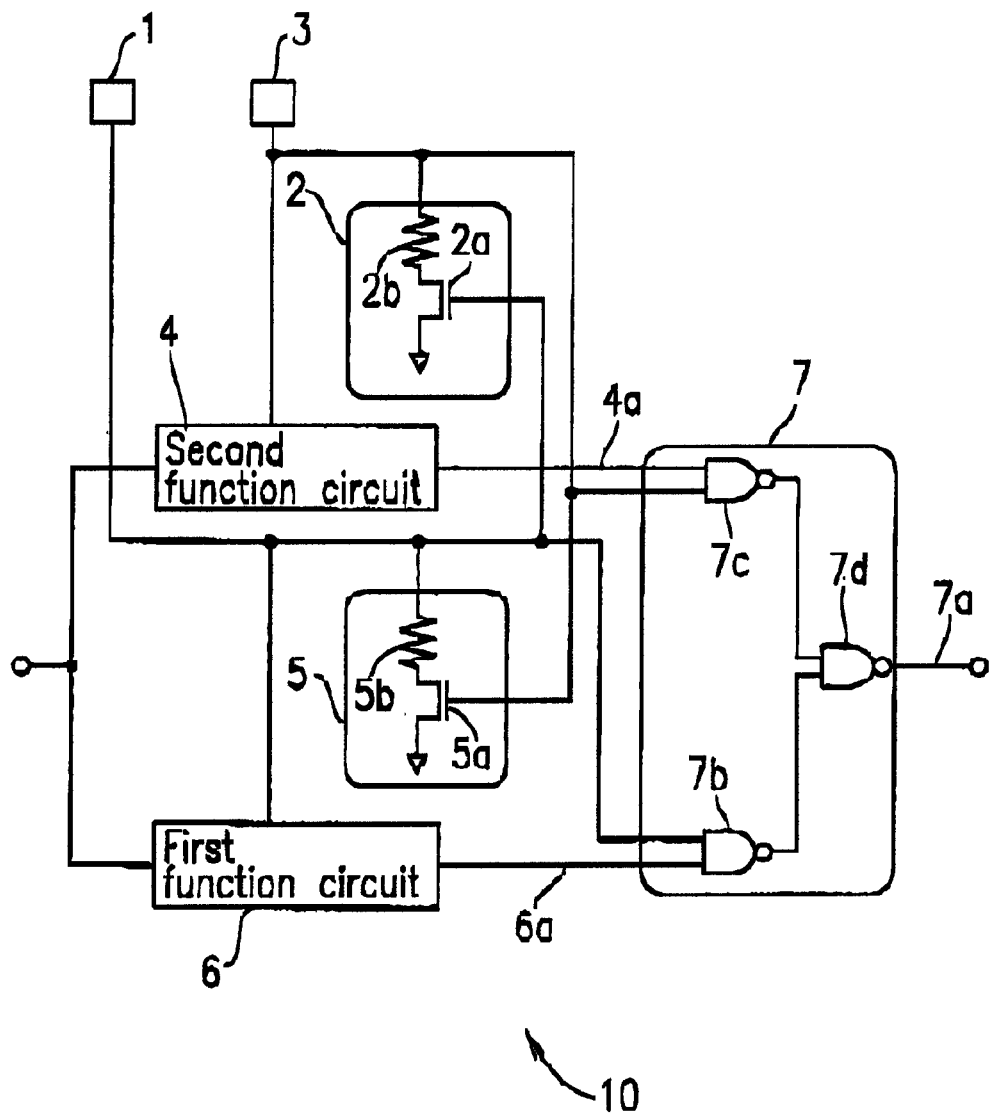
FIG. 3 is a block diagram illustrating a specific structure of the function selecting circuit 10 shown in FIG. 2.

FIG. 3 shows a specific example of the functional selecting circuit 10 shown in FIG. 2. Identical elements previously discussed with respect to FIG. 2 bear identical reference numerals.

FIG. 3 shows internal structures of the first power supply control circuit 5, the second power supply control circuit 2, and the signal control circuit 7.

The first power supply control circuit 5 includes an nMOS transistor 5a (switching element) and a resistor 5b connected to the nMOS transistor 5a in series. The resistor 5b is connected to the first power supply pad 1, and the nMOS transistor 5a is connected between the resistor 5b and ground.

Likewise the second power supply control circuit 2 includes an nMOS transistor 2a (switching element) and a resistor 2b connected to the nMOS transistor 2a in series. The resistor 2b is connected to the second power supply pad 3, and the nMOS transistor 2a is connected between the resistor 2b and ground.

In the example shown in FIG. 3, the first function circuit 6 operates when the first power supply pad 1 is at a power supply potential, and does not operate when the first power supply pad 1 is at the ground potential. The second function circuit 4 operates when the second power supply pad 3 is at a power supply potential, and does not operate when the second power supply pad 3 is at the ground potential.

A gate of the nMOS transistor 5a is connected to the second power supply pad 3. Accordingly, the nMOS transistor 5a is turned on when the second power supply pad 3 is at the power supply potential. A gate of the nMOS transistor 2a is connected to the first power supply pad 1. Accordingly, the nMOS transistor 2a in turned on when the first power supply pad 1 is at the power supply potential.

The signal control circuit 7 includes a first NAND gate 7b for receiving an output 6a of tho first function circuit 6 and the potential of the first power supply pad 1, a second NAND gate 7a for receiving an output 4a of the second function circuit 4 and the potential of the second power supply pad 3, and a third NAND gate 7d for receiving an output of the NAND gate 7b and an output of the NAND gate 7a.

In the example shown in FIG. 3, the first function circuit 6 and the second function circuit 4 each output a low level (ground potential) signal while not in operation.

For selecting the first function circuit 6, the first power supply pad 1 is connected to the power supply to be fixed to a high level (power supply potential). Thus, the first function circuit 6 becomes operable.

When the first power supply pad 1 is fixed to the power supply potential, the nMOS transistor 2a of the second power supply control circuit 2 is turned on, and the second power supply pad 3 is grounded via the resistor 2b. As a result, the second function circuit 4 connected to the second power supply pad 3 becomes inoperable, and the output of the second function circuit 4 is of a low level. In this state, the potential of the second function circuit 4 does not fluctuate, and thus there is no possibility of the second function circuit 4 undesirably malfunctioning.

When the second power supply pad 3 is grounded, the nMOS transistor 5a of the first power supply control circuit 5 is turned off. When the nMOS transistor 5a is turned off, the first power supply pad 1 is disconnected from ground, and thus the shoot-through current from the first power supply pad 1 in shielded from flowing to the first power supply control circuit 5. Therefore, the function selecting circuit 10 operates at a low power consumption.

The first NAND gate 7b of the signal control circuit 7 receives the output 6a of the first function circuit 6 and the potential of the first power supply pad 1 connected to the power supply (high level potential). The first NAND gate 7b inverts the output 6a of the first function circuit 6 and outputs the inverted signal. The second NAND gate 7a receives the output 4a (low level potential) of the second function circuit 4 and the potential of the second power supply pad 3 which is grounded (low level potential). The second NAND gate 7a outputs a high level signal. The output 7a of the third NAND gate 7d which has received the output of the first NAND gate 7b and the output of the second NAND gate 7c is equal to the output 6a of the first function circuit 6.

For selecting the second function circuit 4, the second power supply pad 3 is connected to the power supply to be fixed to the power supply potential. Thus, the second function circuit 4 becomes operable. In this case also, there in no possibility of the first function circuit 6 undesirably malfunctioning. The shoot-through current from the second power supply pad 3 is shielded from flowing to the second power supply control circuit 2. In this way, the function selecting circuit 10 operates at a low power consumption and acquires a high level of reliability in operation.

The output 7a of the third NAND gate 7d which has received the output of the first NAND gate 7b and the output of the second NAND gate 7c is equal to the output 4a of the second function circuit 4.

As described above, a signal from the first function circuit 6 or a signal from the second function circuit 4 can be selectively output only by connecting either the first power supply pad 1 or the second power supply pad 3 to the power supply. There is no need to provide an external control signal for selecting either the signal from the first function circuit 6 or the signal from the second function circuit 4.

Instead of the nMOS transistors 5a and 2a, any switching circuit including at least one switching element (for example, a CMOS switch) is usable.

The first function circuit 6 and the second function circuit 4 can each be, for example, a VCO (voltage controlled oscillator) circuit.

Figure 4:
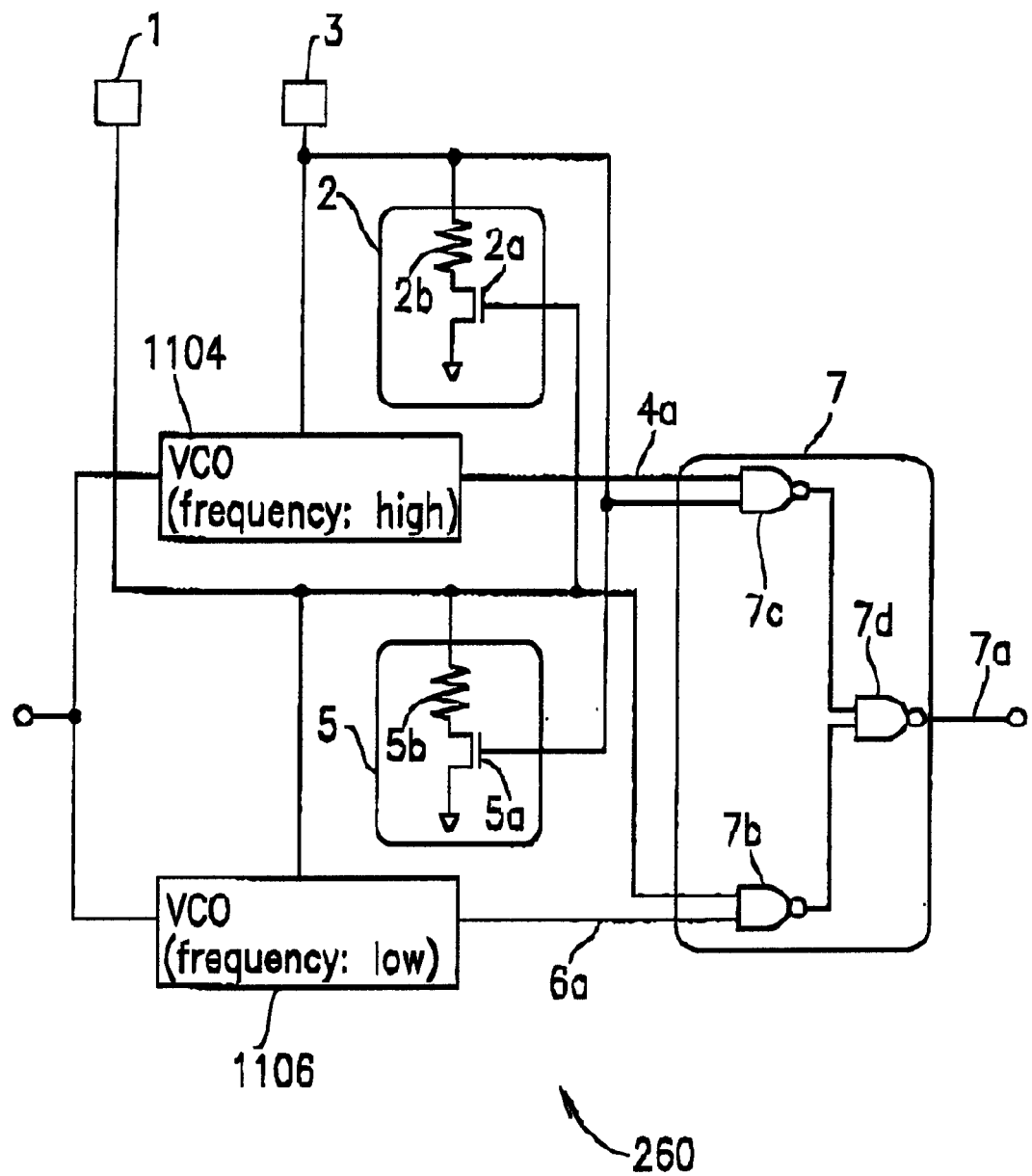
FIG. 4 is a block diagram illustrating a function selecting circuit 260 having VCO circuits as function circuits as another example of the function selecting circuit according to the present invention.

FIG. 4 shows a structure of a functional selecting circuit 260 having VCO circuits 1104 and 1106 as function circuits. Identical elements previously discussed with respect to FIG. 3 bear identical reference numerals and the descriptions thereof will be omitted.

The VCO circuits 1104 and 1106 operate at different operating voltages from each other and output signals of different frequencies. The VCO circuit 1104 outputs a signal having a higher frequency than that of the VCO circuit 1106.

In the example shown in FIG. 3, the first function circuit 6 and the second function circuit 4 each operate when the corresponding power supply pad is at the power supply potential and do not operate when the corresponding power supply pad is at the ground potential. However, the function selecting circuit may be structured so that the first function circuit 6 and the second function circuit 4 each operate when the corresponding power supply pad is at the ground potential and do not operate when the corresponding power supply pad is at the power supply potential. A function selecting circuit having such a structure will be described with reference to FIG. 5.

Figure 5:
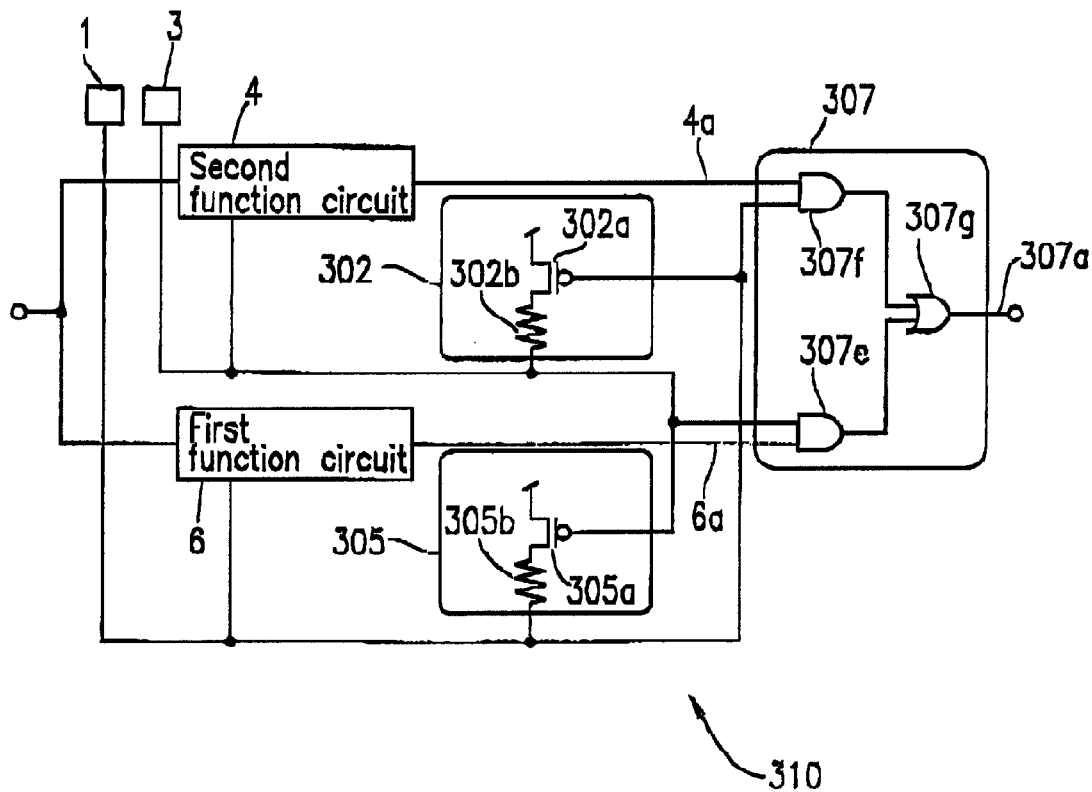
FIG. 5 is a block diagram illustrating a structure of a function selecting circuit 310 as still another example of the function selecting circuit according to the present invention.

FIG. 5 shows a structure of a function selecting circuit 310. The function selecting circuit 310 is different from the function selecting circuit 10 shown in FIG. 3 in the polarity of the power supply connected to the first power supply pad 1 and the second power supply pad 3. The function selecting circuit 310 selects either the first function circuit 6 or the second function circuit 4 by grounding the power supply pad corresponding to the function circuit (1 or 3) which is to be selected. Identical elements previously discussed with respect to FIG. 3 bear identical reference numerals and the descriptions thereof will be omitted.

The function selecting circuit 310 includes a first power supply control circuit 305, a second power supply control circuit 302 and a signal control circuit 307, instead of the first power supply control circuit 5, the second power supply control circuit 2 and the signal control circuit 7 of the function selecting circuit 10 (FIG. 3). The function selecting circuit 310 in usable instead of the function selecting circuit 10 in the semiconductor integrated circuit 500 (FIG. 1).

The first power supply control circuit 305 includes a pMOS transistor 305a (switching element) and a resistor 305b connected to the pMOS transistor 305a in series. The resistor 305b is connected to the first power supply pad 1, and the pMOS transistor 305a is connected between the resistor 305b and a power supply.

Likewise, the second power supply control circuit 302 includes a pMOS transistor 302a (switching element) and a resistor 302b connected to the pMOS transistor 302a in series. The resistor 302b is connected to the second power supply pad 3, and the pMOS transistor 302a is connected between the resistor 302b and the power supply.

In the example shown in FIG. 5, the first function circuit 6 operates when the first power supply pad 1 is at the ground potential and does not operate when the first power supply pad 1 is at the power supply potential. The second function circuit 4 operates when the second power supply pad 3 is at the ground potential and does not operate when the second power supply pad 3 is at the power supply potential.

A gate of the pMOS transistor 305a in connected to the second power supply pad 3. Accordingly, the pMOS transistor 305a is turned on when the second power supply pad 3 is at the ground potential. A gate of the pMOS transistor 302a is connected to the first power supply pad 1. Accordingly the pMOS transistor 302a is turned on when the first power supply pad 1 is at the ground potential.

The signal control circuit 307 includes a first AND gate 307e for receiving an output 6a of the first function circuit 6 and the potential of the second power supply pad 3, a second AND gate 307f for receiving an output 4a of the second function circuit 4 and the potential of the first power supply pad 1, and an OR gate 307g for receiving an output of the AND gate 307e and an output of the AND gate 307f.

In the example shown in FIG. 5, the first function circuit 6 and the second function circuit 4 each output a low level (ground potential) signal while not in operation.

For selecting the first function circuit 6, the first power supply pad 1 is grounded to be fixed to a low level (ground potential). Thus, the first function circuit 6 becomes operable.

When the first power supply pad 1 is grounded, the pMOS transistor 302a of the second power supply control circuit 302 is turned on, and the second power supply pad 3 is connected to the power supply via the resistor 302b. As a result, the second function circuit 4 connected to the second power supply pad 3 becomes inoperable, and the output of the second function circuit 4 is of a low level. In this state, the potential of the second f unction circuit 4 does not fluctuate, and thus there is no possibility of the second function circuit 4 undesirably malfunctioning.

When the second power supply pad 3 is connected to the power supply, the pMOS transistor 305a of the first power supply control circuit 5 is turned off. When the pMOS transistor 305a is turned off, the first power supply pad is disconnected from the power supply, and thus the shoot-through current from the first power supply pad 1 is shielded from flowing to the first power supply control circuit 5. Therefore, the function selecting circuit 310 operates at a low power consumption.

The AND gate 307a of the signal control circuit 307 receives the output 6a of the first function circuit 6 and the potential of the second power supply pad 3 connected to the power supply (high level potential). The first AND gate 307e outputs a signal which is equal to the output 6a of the first function circuit 6. The second AND gate 307f receives the output 4a of the second function circuit 4 (low level potential) and the potential of the first power supply pad 1 which is grounded (low level potential). The second AND gate 307f outputs a low level potential. The OR gate 307g which has received the output from the first AND gate 307e and the output of the second AND gate 307f outputs a signal which ia equal to the output 6a of the first function For selecting the second function circuit 4, the second power supply pad 3 is grounded to be fixed to the ground potential. Thus, the second function circuit 4 becomes operable. When the second power supply pad 3 is fixed to the ground potential, the pMOS transistor 305a of the first power supply control circuit 305 is turned on, and the first power supply pad 1 is fixed to the power supply potential. Thus, there is no possibility of the first function circuit 6 undesirably malfunctioning. Since the pMOS transistor 302a of the second power supply control circuit 302 in turned off, the shoot-through current from the second power supply pad 3 is shielded from flowing to the second power supply control circuit 302. In this way, the function selecting circuit 310 operates at a low power consumption.

When the second function circuit 4 is selected, the OR gate 307g of the signal control circuit 307 outputs a signal which is equal to the output 4a of the second function circuit 4.

As described above, a signal from the first function circuit 6 or a signal from the second function circuit 4 can be selectively output only by grounding either the first power supply pad 1 or the second power supply pad 3.

According to the principle of the present invention, the function selecting circuit may be structured so that one of the first function circuit 6 and the second function circuit 4 operates when the corresponding power supply pad is at the power supply potential and the other of the circuits operated when the corresponding power supply pad is at the ground potential. A function selecting circuit having such a structure will be described with reference to FIG. 6.

Figure 6:
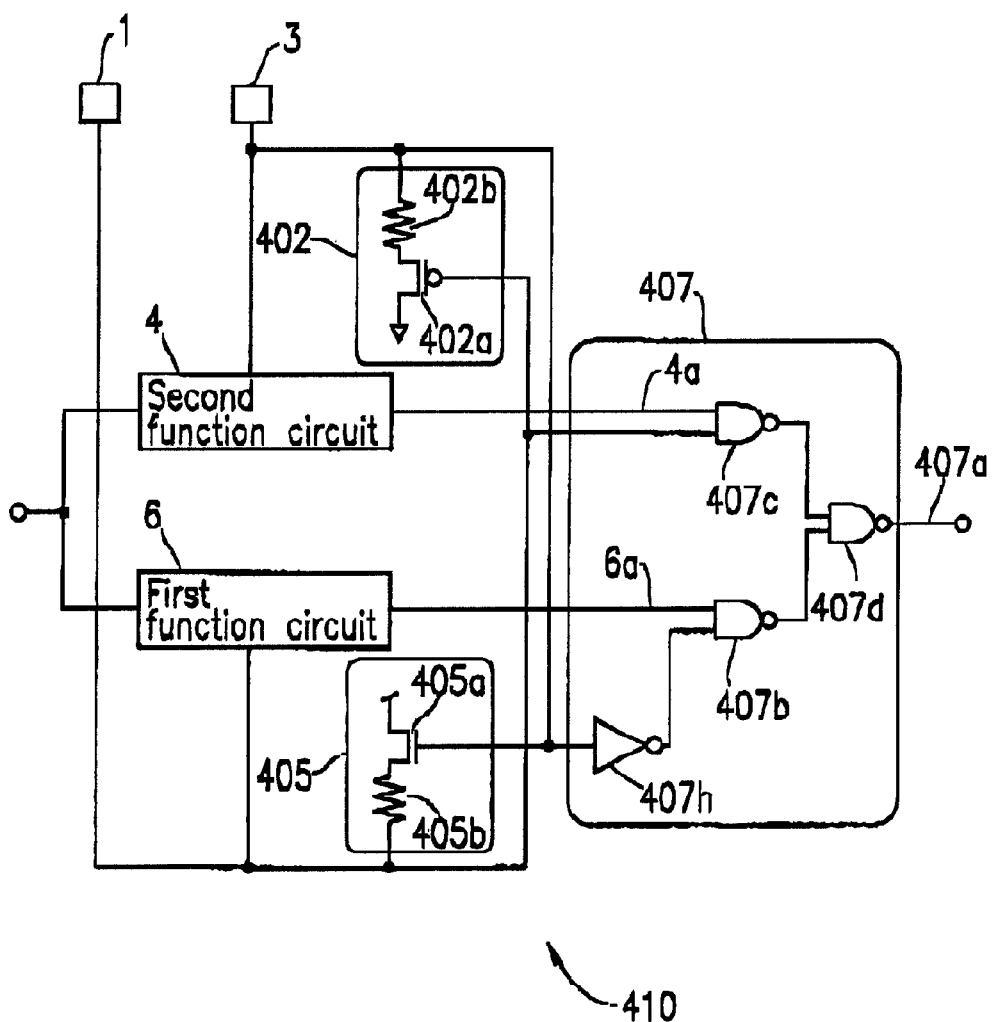
FIG. 6 in a block diagram illustrating a structure of a function selecting circuit 410 as still another example of the function selecting circuit according to the present invention.

FIG. 6 shows a structure of a function selecting circuit 410. Identical elements previously discussed with respect to FIG. 3 bear identical reference numerals and the descriptions thereof will be omitted.

The function selecting circuit 410 includes a first power supply control circuit 405, a second power supply control circuit 402 and a signal control circuit 407, instead of the first power supply control circuit 5, the second power supply control circuit 2 and the signal control circuit 7 of the function selecting circuit 10 (FIG. 3). The function selecting circuit 410 is usable instead of the function selecting circuit 10 in the semiconductor integrated circuit 500 (FIG. 1).

The first power supply control circuit 405 includes an nMOS transistor 405a (switching element) and a resistor 405b connected to the nMOS transistor 405a in series. The resistor 405b is connected to the first power supply pad 1, and the nMOS transistor 405a is connected between the resistor 405b and a power supply.

Likewise, the second power supply control circuit 402 includes a pMOS transistor 402a (switching element) and a resistor 402b connected to the pMOS transistor 402a in series. The resistor 402b is connected to the second power supply pad 3, and the pMOS transistor 402a is connected between the resistor 402b and ground.

In the example shown in FIG. 6, the first function circuit 6 operates when the first power supply pad 1 is at the ground potential and does not operate when the first power supply pad 1 is at the power supply potential. The second function circuit 4 operates when the second power supply pad 3 in at the power supply potential and does not operate when the second power supply pad 3 is at the ground potential.

A gate of the nMOS transistor 405a is connected to the second power supply pad 3. Accordingly, the nMOS transistor 405a is turned on when the second power supply pad 3 is at the power supply potential. A gate of the pMOS transistor 402a is connected to the first power supply pad 1. Accordingly, the pMOS transistor 402a is turned on when the first power supply pad 1 is at the ground potential.

The signal control circuit 407 includes a first NAND gate 407b for receiving an output 6a of the first function circuit 6 and the inverted potential of the first power supply pad 3 through an inverter 407h, a second NAND gate 407c for receiving an output 4a of the second function circuit 4 and the potential of the first power supply pad 1, and a third NAND gate 407d for receiving an output of the NAND gate 407b and an output of the NAND gate 407c In the example shown in FIG. 6, the first function circuit 6 or the second function circuit 4 each output a low level (ground potential) signal while not in operation.

For selecting the first function circuit 6, the first power supply pad 1 is grounded to be fixed to a low level (ground potential). Thus, the first function circuit 6 becomes operable.

When the first power supply pad 1 is grounded, the pMOS transistor 402a of the second power supply control circuit 402 is turned on, and the second power supply pad 3 is grounded via the resistor 402b. As a result, the second function circuit 4 connected to the second power supply pad 3 becomes inoperable, and the output of the second function circuit 4 is of a low level. In this state, the potential of the second function circuit 4 does not fluctuate, and thus there is no possibility of the second function circuit 4 undesirably malfunctioning.

When the second power supply pad 3 is grounded, the nMOS transistor 405a of the first power supply control circuit 405 is turned off when the nMOS transistor 405a is turned off, the first power supply pad 1 is disconnected from the power supply, and thus the shoot-through current from the first power supply pad 1 in shielded from flowing to the first power supply control circuit 405. Therefore, the function selecting circuit 410 operates at a low power consumption.

The NAND gate 407b of the signal control circuit 407 receives the output 6a of the first function circuit 6 and a potential (high level potential) obtained by inverting (using the inverter 407h) the potential of the second power supply pad 3 which is grounded (low level potential). The first NAND gate 407b outputs a signal which is obtained by inverting the output 6a of the first function circuit 6. The second NAND gale 407c receives the output 4a of the second function circuit 4 (low level potential) and the potential of the first power supply pad 1 which is connected to the power supply (high level potential). The second NAND gate 407c outputs a high level signal. The third NAND gate 407d which has received the output from the first NAND gate 407b and the output of the second NAND gate 407c outputs an output 407a which in equal to the output 6a of the first function circuit 6.

For selecting the second function circuit 4, the second power supply pad 3 is connected to the power supply to be fixed to the power supply potential. Thus, the second function circuit 4 becomes operable. When the second power supply pad 3 is fixed to the power supply potential, the nMOS transistor 405a of the first power supply control circuit 405 is turned on, and the first power supply pad 1 is fixed to the power supply potential. Thus, there is no possibility of the first function circuit 6 undesirably malfunctioning. Since the pMOS transistor 402a of the second power supply control circuit 402 is turned off, the shoot-through current from the second power supply pad 3 is shielded from flowing to the second power supply control circuit 402. Therefore, the function selecting circuit 410 operates at a low power consumption.

When the second function circuit 4 is selected, the third NAND gate 407d of the signal control circuit 407 outputs a signal which is equal to the output 4a of the second function circuit 4.

As described above, a signal from the first function circuit 6 or a signal from the second function circuit 4 can be selectively output only by grounding the first power supply pad 1 or connecting the second power supply pad 3 to the power supply.

In the examples described with reference to FIGS. 3 through 6, one of two function circuits is selected. The present invention is not limited to such a structure and in applicable to a function selecting circuit for selecting one of any number of function circuits.

Figure 7:
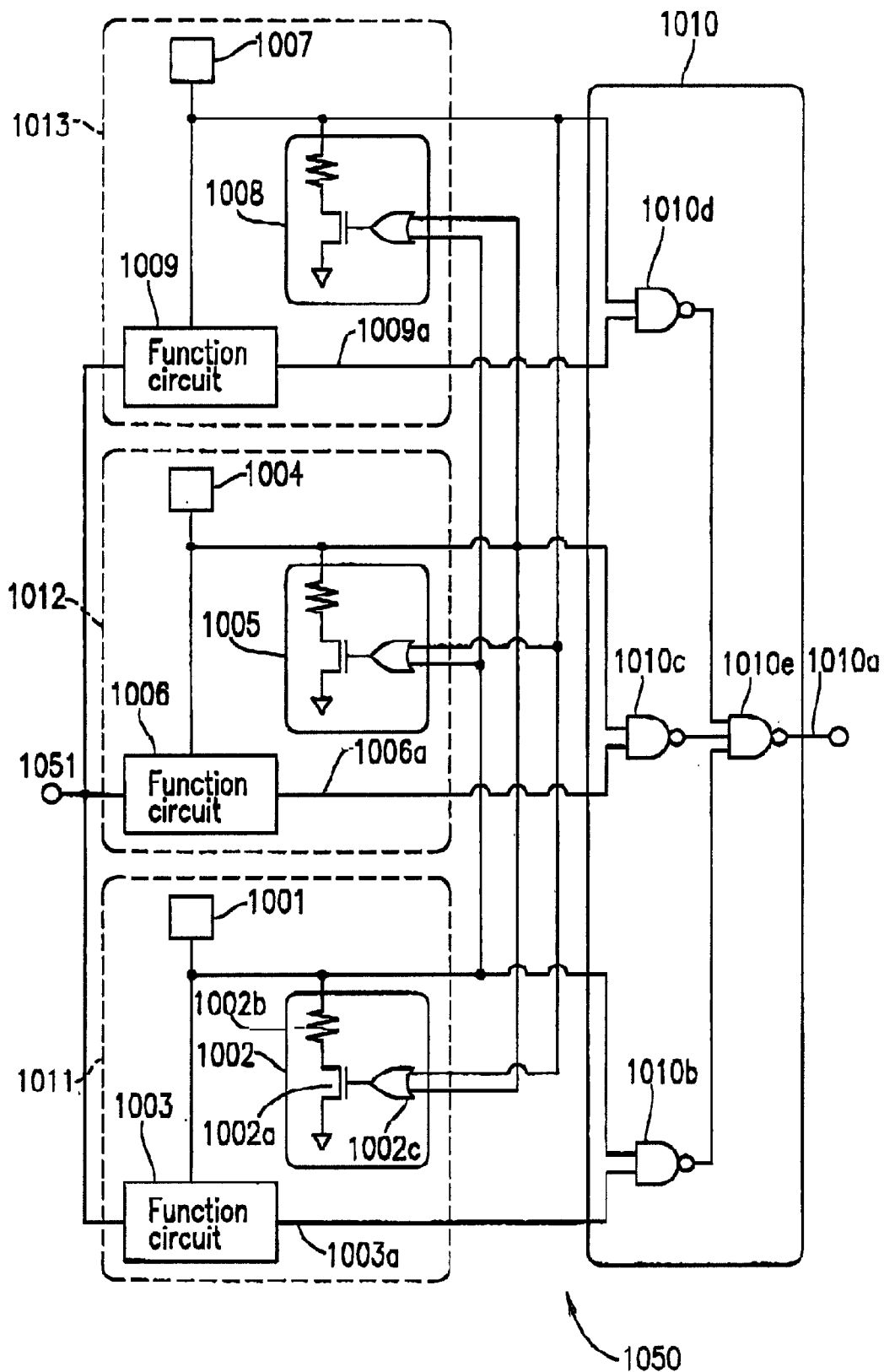
FIG. 7 is a block diagram illustrating a structure of a function selecting circuit 1050 for selecting one of three function circuits as still another example of the function selecting circuit according to the present invention.

FIG. 7 shows a structure of a function selecting circuit 1050 for selecting one of three function circuits. The function selecting circuit 1050 includes three units 1011 through 1013 and a signal control circuit 1010. The function selecting circuit 1050 is usable instead of the function selecting circuit 10 (FIG. 3) in the semiconductor integrated circuit 500 (FIG. 1).

The units 1011 includes a power supply pad 1001, a function circuit 1003, and a power supply control circuit 1002. The power supply control circuit 1002 includes an nMOS transistor 1002a (switching element), a resistor 1002b connected to the nMOS transistor 1002a in series, and an OR gate 1002c. The resistor 1002b is connected to the power supply pad 1001, and the nMOS transistor 1002a is connected between the resistor 1002b and ground. An output of the OR gate 1002c is connected to a gate of the nMOS transistor 1002a. The function circuit 1003 operates when the power supply pad 1001 is at the power supply potential (prescribed operating potential), and does not operate when the power supply pad 1001 is at the ground potential (prescribed non-operating potential). Herein, a state in which the function circuit 1003 is in operation because the power supply pad 1001 is at the power supply potential is defined as the "state where the unit 1011 is in an operating state (first state)". A state in which the function circuit 1003 is not in operation because the power supply pad 1001 is at the ground potential is defined as the "state where the unit 1011 is in a non-operating state (second state)". Thus, the unit 1011 has an operating (first) state and a non-operating (second) state.

The nMOS transistor 1002a included in the power supply control circuit 1002, when turned on (when the switching element is closed), connects the power supply pad 1001 to the ground potential (prescribed non-operating state) via the resistor 1002b. The nMOS transistor 1002a, when turned off (when the switching element is opened), disconnects the power supply pad 1001 from the ground potential.

The unit 1012 includes a power supply pad 1004, a function circuit 1006, and a power supply control circuit 1005. The power supply control circuit 1005 has a structure similar to that of the power supply control circuit 1002. The function circuit 1006 operates when the power supply pad 1004 in at the power supply potential (prescribed operating potential), and does not operate when the power supply pad 1004 is at the ground potential (prescribed non-operating potential). The unit 1012 has an operating state and a non-operating state like that of the unit 1011.

The unit 1013 includes a power supply pad 1007, a function circuit 1009, and a power supply control circuit 1008. The power supply control circuit 1008 has a structure similar to that of the power supply control circuit 1002. The function circuit 1009 operates when the power supply pad 1007 is at the power supply potential (prescribed operating potential), and does not operate when the power supply pad 1007 is at the ground potential (prescribed non-operating potential). The unit 1013 has an operating state and a non-operating state like that of the unit 1011.

The function circuits 1003, 1006 and 1009 respectively realize prescribed functions. The function circuits 1003, 1006 and 1009 respectively execute prescribed processing based on a signal which is input to a common input terminal 1051 to generate outputs 1003a, 1006a and 1009a. It is assumed here that each of the outputs 1003a, 1006a and 1009a of each of the respective function circuits 1003, 1006 and 1009 are of a low level when each of the function circuits 1003, 1006 and 1009 is not in operation.

Each function circuit 1003, 1006, 1009 is not limited to have any specific function, and may have any function.

The OR gate 1002c included in the power supply control circuit 1002 receives the potential of the power supply pad 1004 and the potential of the power supply pad 1007. Accordingly, the nMOS transistor 1002a is turned on when either the power supply pad 1004 or the power supply pad 1007 is at the power supply potential, and turned off otherwise. The state where the power supply pad 1004 is at the power supply potential means that the unit 1012 is in an operating state. The state where the power supply pad 1007 is at the power supply potential means that the unit 1013 is in an operating state.

In this manner, the power supply control circuit 1002 included in the unit 1011 grounds the power supply pad 1001 by turning on the nMOS transistor 1002a when either one of the other units (unit 1012 or unit 1013) is in an operating state. Otherwise, the power supply control circuit 1002 disconnects the power supply pad 1001 from ground by turning off the nMOS transistor 1002a.

The power supply control circuit 1005 and the power supply control circuit 1008 operate in a manner similar to that of the power supply control circuit 1002.

The signal control circuit 1010 includes four NAND gates 1010b, 1010c, 1010d and 1010e.

The NAND gate 1010b receives an output 1003a of the function circuit 1003 and the potential of the power supply pad 1001. The NAND gate 1010c receives an output 1006a of the function circuit 1006 and the potential of the power supply pad 1004. The NAND gate 1010d receives an output 1009a of the function circuit 1009 and the potential of the power supply pad 1007. The NAND gate 1010e receives outputs from the three NAND gates 1010b, 1010c and 1010d.

For selecting the function circuit 1003, the power supply pad 1001 is grounded to be fixed to a low level potential (ground potential). Thus, the function circuit 1003 becomes operable. At this point, the unit 1011 is put into an operating state. The power supply control circuit 1005 of the unit 1012 grounds the power supply pad 1004 when either one of the other units (units 1011 or 1013) is in an operating state (first state). Since the unit 1011 is in the operating state, the power supply control circuit 1005 grounds the power supply pad 1004. Likewise, the power supply control circuit 1008 grounds the power supply pad 1007. Thus, there is no possibility of the function circuit 1006 or 1009 undesirably malfunctioning.

When the power supply control circuit 1005 grounds the power supply pad 1004 and the power supply control circuit 1008 grounds the power supply pad 1007, the units 1012 and 1013 are put into a non-operating state. Therefore, the power supply control circuit 1002 of the unit 1011 turns off the nMOS transistor 1002a. Accordingly, the shoot-through current from the power supply pad 1001 is shielded from flowing to the power supply control circuit 1002.

Thus, the function selecting circuit 1050 operates at a low power consumption.

The NAND gate 1010b of the signal control circuit 1010 receives the output 1003a of the function circuit 1003 and the potential of the power supply pad 1001. The NAND gate 1010b outputs a signal which is obtained by inverting the output 1003a of the function circuit 1003. The NAND gate 1010c receives the output 1006a of the function circuit 1006 (low level) and the potential of the power supply pad 1004 (low level). The NAND gate 1010c outputs a high level signal. Likewise, the NAND gate 1010d outputs a high level signal. Since the NAND gate 1010c receives the outputs of the three NAND gates 1010b, 1010c and 1010d, the output 1010a of the NAND gate 1010e is equal to the output 1003a of the function circuit 1003.

For selecting the function circuit 1006, the power supply pad 1004 is connected to the power supply to be fixed to the power supply potential. For selecting the function circuit 1009, the power supply pad 1007 is connected to the power supply to be fixed to the power supply potential.

In this manner, one or the outputs signals from the function circuits 1003, 1006 and 1009 can be selectively output only by connecting either one or the power supply pads 1001, 1004 and 1007 to the power supply.

An unselected function circuit is prevented from malfunctioning. The shoot-through current from the power supply pad corresponding to the selected function circuit is shielded from flowing to the power supply control circuit of the same unit as that of the selected function circuit.

The principle described above with reference to FIG. 7 is applicable to any function selecting circuit for selecting one of a plurality of function circuits.

In the above description regarding the function selecting circuit 1050 shown In FIG. 7, it is assumed that each of the function circuits of the three units operates when the power supply pad of the corresponding unit is at the power supply potential and does not operate when the power supply pad of the corresponding unit is at the ground potential. However, the operating potentials may be different among a plurality of units. As described above with reference to FIGS. 3 through 6, the present invention is applicable to the structure in which the operating potentials are different among a plurality of units.

In the semiconductor integrated circuit 500 shown in FIG. 1, the power supply pad of the selected function circuit (power supply pad 1 or 3) is connected to a lead frame terminal 22 at a prescribed operating potential (power supply potential or ground potential) via a bonding wire (conductive member) 24. However, the function circuit may be selected without using a bonding wire. Such a structure will be described with reference to FIG. 8.

Figure 8:
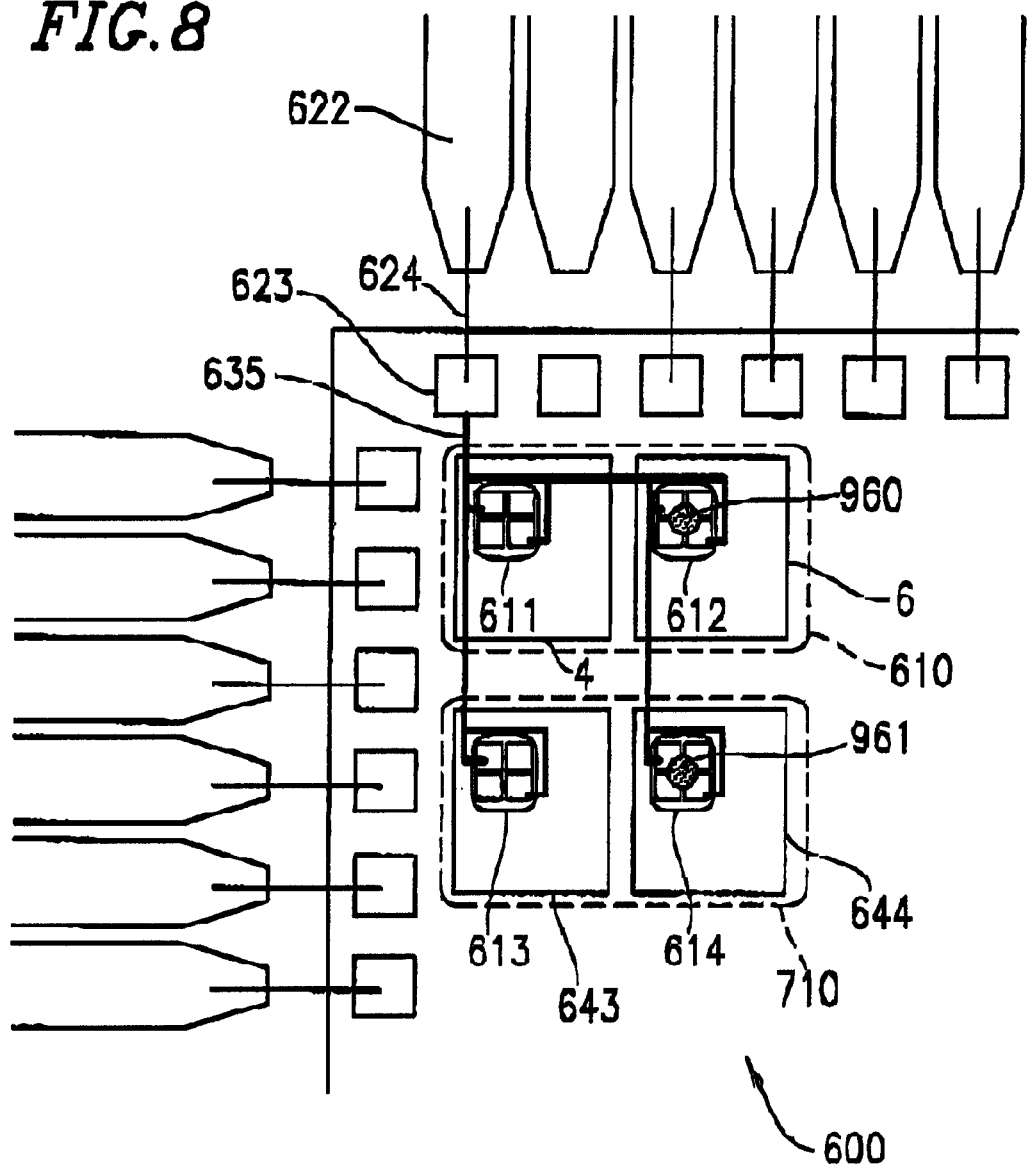
FIG. 8 is a schematic diagram illustrating another semiconductor integrated circuit 600 according to the present invention.

FIG. 8 shows a semiconductor integrated circuit 600 according to the present invention. The semiconductor integrated circuit 600 includes function selecting circuits 610 and 710. A bonding pad 623 is connected to one lead frame terminal 622 by a bonding wire 624. The lead frame terminal 622 is at a prescribed potential (for example, the power supply potential). A wire 635 is connected to the bonding pad 623.

The function selecting circuit 610 includes a first function circuit 6, a second function circuit 4, a first electrode section 611, and a second electrode section 612. The function selecting circuit 710 includes function circuits 643 and 644 and electrode sections 613 and 614.

Figure 9:
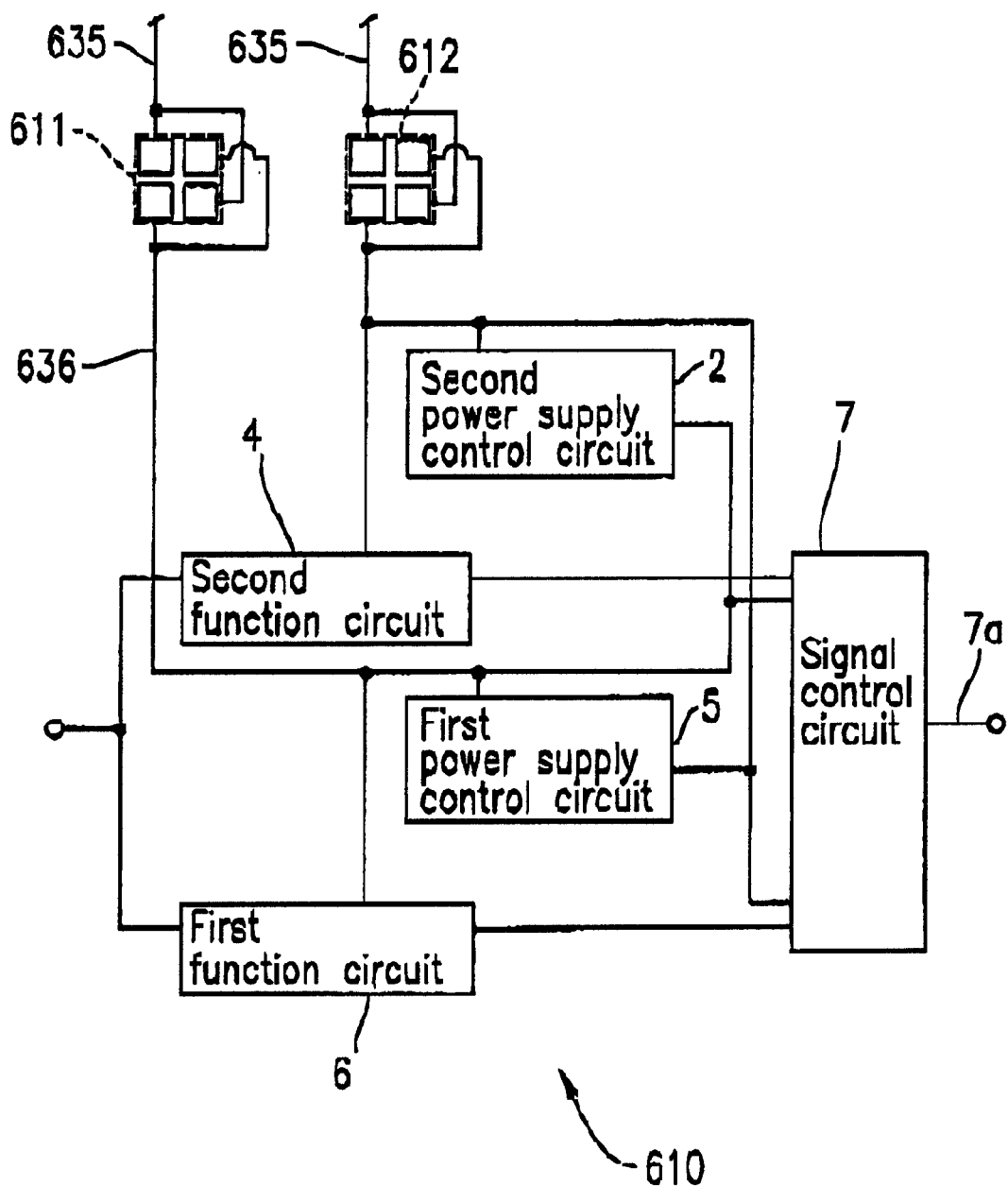
FIG. 9 is a block diagram illustrating a structure of a function selecting circuit 610 of the semiconductor integrated circuit shown in FIG. 8.

FIG. 9 shows a structure of the function selecting circuit 610 shown in FIG. 8.

The function selecting circuit 610 includes the first and second electrode sections 611 and 612 instead of the first power supply pad 1 and the second power supply pad 3 shown in FIG. 2. Identical elements previously discussed with respect to FIG. 2 bear identical reference numerals and the descriptions thereof will be omitted.

The function selecting circuit 710 shown in FIG. 8 has the same structure as that of the function selecting circuit 610.

Figure 10:
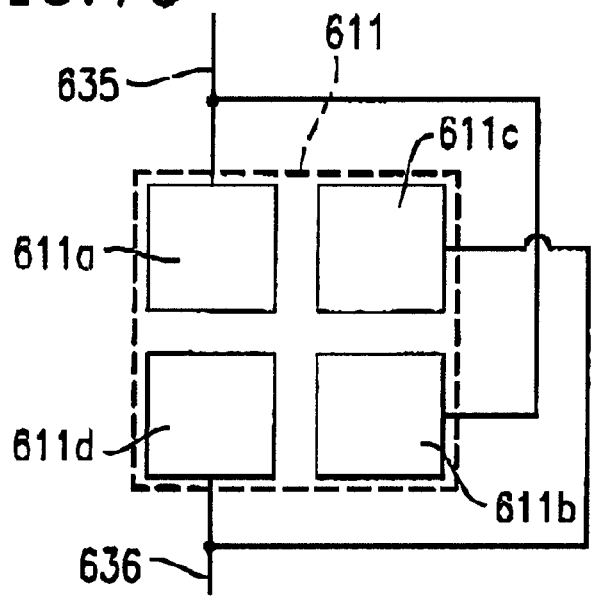
FIG. 10 is a schematic plan view illustrating a first electrode section 611 included in the function selecting circuit 610 shown in FIG. 9.

FIG. 10 in a schematic plan view illustrating a structure or the first electrode section 611. The first electrode section 611 includes four terminal regions 611a, 611b, 611c and 611d. The four terminal regions 611a, 611b, 611c and 611d are each square. The terminal regions 611a and 611b arranged on one diagonal line are connected to a wire 635, and the terminal regions 611c and 611d arranged on another diagonal line are connected to a wire 636. The wire 635 in connected to the power supply (or ground), and the wire 636 is connected to the first function circuit 6.

The electrode sections 612, 613 and 614 have the same structure as that of the electrode section 611.

Figure 11:
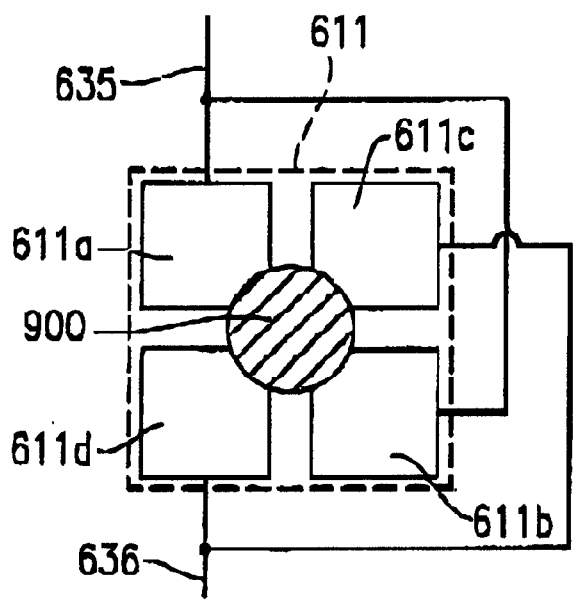
FIG. 11 is a schematic plan view of the first electrode section 611 where a conductive member 900 is applied thereto.

FIG. 11 shows an example of the first electrode section 611 in which a conductive member 900 is applied thereto. The conductive member 900 is formed of, for example, conductive ink. Conductive ink is preferable for the conductive member 900 since it can easily place the terminal regions 611a through 611d in a conductive state when applied thereto. By the application of the conductive member 900, the terminal regions 611a through 611d are connected to one another. Then, the wires 635 and 636 are connected to each other, and thus the first function circuit 6 (FIG. 9) is supplied with the power supply potential (or the ground potential). In this manner, the function circuit 6 is selected by the function selecting circuit 610 (FIG. 9).

The terminal regions 611a said 611b (a plurality of first terminal regions) shown in FIG. 10 are always connected to a potential at which the first function circuit 6 is operable. When the terminal region 611c and 611d (a plurality of second terminal regions) shown in FIG. 10 are connected to the terminal regions 611a and 611b via the conductive member 900 (FIG. 11), the terminal regions 611c and 611d are supplied with the power supply potential, and thus the first function circuit 6 becomes operable. Thus the plurality of first terminal regions (611a and 611b) act together as a terminal having a prescribed operating potential.

In the example shown in FIG. 11, the conductive member 900 is applied to the plurality of first terminal regions and the plurality of second terminal regions. Alternatively, the conductive member 900 may be caused to adhere by pressure to the plurality of first terminal regions and the plurality of second terminal regions. In this case, aluminum or solder, for example, is preferably unable as the conductive member 900.

The number of terminal regions which are always connected to the potential at which the first function circuit 6 is operable (first terminal regions) is not limited to two. The number of terminal regions which are connected to the first function circuit (second terminal regions) is not limited to two. The shape of each terminal region is not limited to a square.

In the function selecting circuit 610 shown in FIG. 8, a conductive member 960 is applied to the second electrode section 612. Thus, the function circuit 4 is selected. In the function selecting circuit 710 shown in FIG. 8, a conductive member 961 is applied to the electrode section 614. Thus, the function circuit 644 is selected.

The semiconductor integrated circuit 600 shown in FIG. 8 allows a power supply pad for function selection to be located in an area of the semiconductor integrated circuit 600 which cannot be directly connected to the power supply pad by a bonding wire (e.g., in an area, direct connection to which can generate an adverse effect by an impact or wire bonding). A prescribed function circuit can be selected by connecting the operating potential of the prescribed function circuit to the power supply pad. The structure of the semiconductor integrated circuit 600 allows a prescribed function circuit to be selected even after wire bonding in completed during the production of the semiconductor integrated circuit. Therefore, the selected function circuit can be changed or the trimming process can be done even after the chip assembly is finished.

A semiconductor integrated circuit according to the present invention includes a plurality of units, each of the units comprising a power supply pad, a function circuit, and a power supply control circuit. The plurality of units each have a first state in which the function circuit is in operation by the power supply pad being at a prescribed operating potential and a second state in which the function circuit is not in operation by the power supply pad being at a prescribed non-operating potential. The power supply control circuit includes a switching circuit for connecting the power supply pad to the prescribed non-operating potential.

According to the present invention, the power supply control circuit in each of the plurality of units closes the switching circuit when at lest one of the other units is in the first state. Thus, the power supply pad in each of all the units other than the unit including the selected function circuit is connected to the prescribed non-operating potential. Therefore, the possibility of the unselected function circuits malfunctioning is eliminated. The power supply control circuit in each of the plurality of units opens the switching circuit when none of the other units is in the first state. Thus, a shoot-through current from the power supply pad of the unit including the selected function circuit is shielded from flowing to the power supply control circuit of the same unit. Therefore, the semiconductor integrated circuit operates at a high level of reliability and at a low power consumption.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor integrated circuit including a plurality of units, each of the units comprising a power supply pad, a function circuit, and a power supply control circuit, wherein:

the plurality of units each have a first state in which the function circuit is in operating state by the power supply pad being at a prescribed operating potential and a second state in which the function circuit is in a non-operating state by the power supply pad being at a prescribed non-operating potential, the power supply control circuit includes a switching circuit for connecting the power supply pad to the prescribed non-operating potential, and the power supply control circuit in each of the plurality of units closes the switching circuit when at least one of the other units is in the first state and opens the switching circuit otherwise.

2. A semiconductor integrated circuit according to claim 1, further comprising a resistor connected to the switching circuit in series.

3. A semiconductor integrated circuit according to claim 1, further comprising a signal control circuit for selectively outputting an output from one of the function circuits based on potentials of the power supply pads in the plurality Of units.

4. A semiconductor integrated circuit according to claim 1, wherein the power supply pad in one of the plurality of units is connected to a terminal having the prescribed operating potential via a conductive member.

5. A semiconductor integrated circuit according to claim 4, wherein the conductive member is a bonding wire.

6. A semiconductor integrated circuit according to claim 4, wherein the terminal includes a plurality of first terminal regions, the power supply pad includes a plurality of second terminal regions, and the conductive member is applied or caused to adhere by pressure to the plurality of first terminal regions and the plurality of second terminal regions.

* * * * *